US010211300B2

(12) United States Patent
Hirler et al.

(10) Patent No.: US 10,211,300 B2
(45) Date of Patent: Feb. 19, 2019

(54) METHOD OF FORMING A SEMICONDUCTOR DEVICE

(71) Applicant: Infineon Technologies Austria AG, Villach (AT)

(72) Inventors: Franz Hirler, Isen (DE); Gabor Mezoesi, Villach (AT); Hans Weber, Bayerisch Gmain (DE)

(73) Assignee: Infineon Technologies Austria AG, Villach (AT)

( * ) Notice: Subject to any disclaimer, the term of this patent is extended or adjusted under 35 U.S.C. 154(b) by 1 day.

(21) Appl. No.: 15/452,769

(22) Filed: Mar. 8, 2017

(65) Prior Publication Data

US 2017/0263720 A1    Sep. 14, 2017

(30) Foreign Application Priority Data

Mar. 9, 2016  (DE) .................. 10 2016 104 327

(51) Int. Cl.
*H01L 29/40* (2006.01)
*H01L 21/02* (2006.01)
(Continued)

(52) U.S. Cl.
CPC ...... *H01L 29/408* (2013.01); *H01L 21/02236* (2013.01); *H01L 21/2253* (2013.01);
(Continued)

(58) Field of Classification Search
CPC .................................................. H01L 29/408
(Continued)

(56) References Cited

U.S. PATENT DOCUMENTS 5,994,208 A * 11/1999 Prins ...................... C30B 31/22
                                                        438/527
6,268,295 B1 * 7/2001 Ohta .................. H01L 21/28123
                                                        257/E21.206

(Continued)

FOREIGN PATENT DOCUMENTS

DE    102010060229 A1    5/2011
DE    102014108279 A1    12/2014

OTHER PUBLICATIONS

Valek, Kukas et al., "Defect Engineering During Czochralski Crystal Growth and Silicon Wafer Manufacturing", Modern Aspects of Bulk Crystal and Thin Film Preparation, Chapter 3, www.intechopen.com, Jan. 13, 2012, pp. 34-71.

(Continued)

*Primary Examiner* — Mohammad Choudhry
(74) *Attorney, Agent, or Firm* — Murphy, Bilak & Homiller, PLLC

(57) ABSTRACT

According to an embodiment of a method of forming a semiconductor device, a semiconductor layer including a first dopant species of a first conductivity type and a second dopant species of a second conductivity type different from the first conductivity type is formed. The semiconductor layer is part of a semiconductor body having opposite first and second surfaces. Trenches are formed in the semiconductor layer at the first surface. The trenches are filled with a filling material including at least a semiconductor material. A thermal oxide is formed at one or both of the first and second surfaces, the thermal oxide having a thickness of at least 200 nm. Thermal processing of the semiconductor body causes diffusion of the first and second dopants species into the filling material.

21 Claims, 11 Drawing Sheets

(51) Int. Cl.
*H01L 21/225* (2006.01)
*H01L 21/265* (2006.01)
*H01L 21/324* (2006.01)
*H01L 29/66* (2006.01)
*H01L 29/78* (2006.01)
*H01L 29/06* (2006.01)

(52) U.S. Cl.
CPC ...... *H01L 21/26533* (2013.01); *H01L 21/324* (2013.01); *H01L 29/0634* (2013.01); *H01L 29/401* (2013.01); *H01L 29/407* (2013.01); *H01L 29/66712* (2013.01); *H01L 29/7802* (2013.01); *H01L 29/7811* (2013.01)

(58) Field of Classification Search
USPC ........................................................ 438/454
See application file for complete search history.

(56) References Cited

U.S. PATENT DOCUMENTS

| | | | |
|---|---|---|---|
| 8,183,666 B2 | 5/2012 | Schulze | |
| 8,871,670 B2* | 10/2014 | Seebauer | B82Y 30/00 |
| | | | 502/300 |
| 9,679,774 B2* | 6/2017 | Schulze | H01L 21/2257 |
| 2004/0121565 A1* | 6/2004 | Wieczorek | H01L 21/2022 |
| | | | 438/481 |
| 2006/0226498 A1* | 10/2006 | Davies | H01L 29/0661 |
| | | | 257/409 |
| 2007/0241409 A1* | 10/2007 | Furukawa | H01L 21/26533 |
| | | | 257/372 |
| 2009/0085095 A1* | 4/2009 | Kamath | C23C 18/08 |
| | | | 257/321 |
| 2012/0184095 A1* | 7/2012 | Poelzl | H01L 29/7813 |
| | | | 438/589 |
| 2012/0306046 A1* | 12/2012 | Schmidt | H01L 29/0638 |
| | | | 257/506 |
| 2014/0001514 A1 | 1/2014 | Schulze et al. | |
| 2015/0270130 A1* | 9/2015 | Schulze | H01L 21/02238 |
| | | | 438/474 |

OTHER PUBLICATIONS

Weber, Hans, "Herstellungsverfahren für ein Kompensationsbauelement", Siemens Technik Report, vol. 5, No. 17, Jun. 2002, pp. 1-6.

* cited by examiner

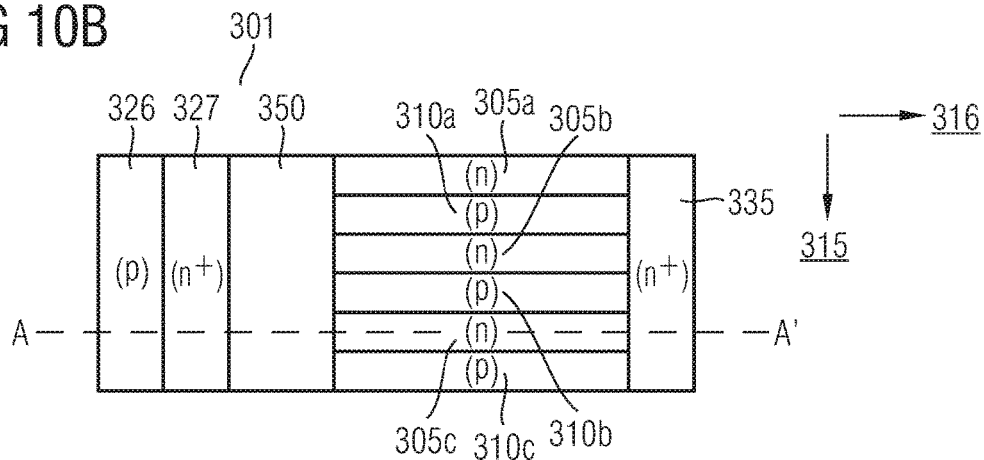
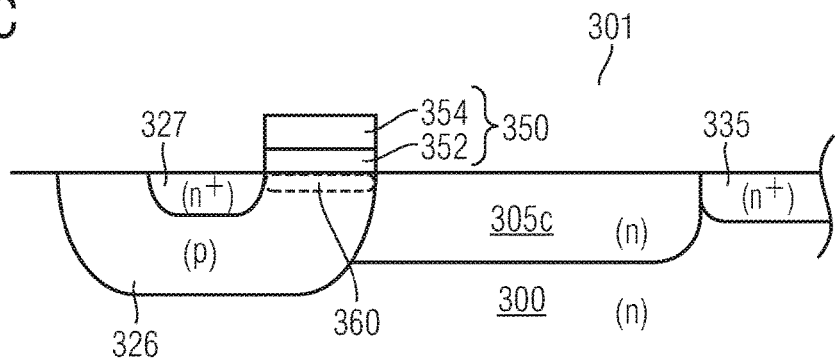
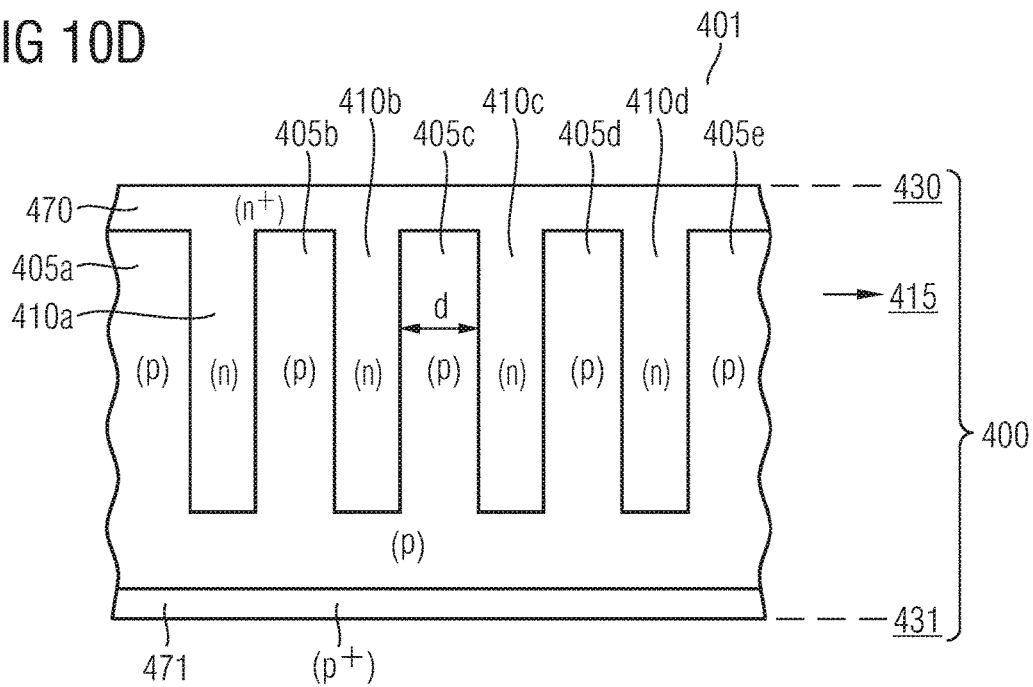

METHOD OF FORMING A SEMICONDUCTOR DEVICE

BACKGROUND

Semiconductor compensation devices such as n- or p-channel Metal Oxide Semiconductor Field Effect Transistors (n-channel or p-channel MOSFETs), diodes, pn junction detectors, Silicon Controlled Rectifiers (SCRs) are frequently used semiconductor products. These devices can be based on mutual compensation of the charge of n- and p-doped regions in a semiconductor body of the device. The n- and p-doped regions are spatially arranged such that, in a reverse operation mode, a space charge of the n-doped region compensates the space charge of the p-doped region. By using this compensation of the p- and n-doping, a doping concentration of dopants of the one of these regions constituting a drift zone can be increased, whereby, despite a possible loss in the current-carrying area, a gain in an area-specific on-resistance $R_{on} \times A$ can be achieved. Production tolerances such as lithographic mismatch or deviations of target dopant concentrations may lead to deviations of desired charge compensation of these n- and p-doped regions. This may have a negative impact on device performance such as decreased device breakdown voltage and may limit the maximum doping concentration of the n- and p-doped regions. For these and other reasons, there is a need for an improved method of manufacturing a semiconductor device.

SUMMARY

The present disclosure relates to a method of forming a semiconductor device. The method comprises forming a semiconductor layer comprising a first dopant species of a first conductivity type and a second dopant species of a second conductivity type different from the first conductivity type, the semiconductor layer being part of a semiconductor body comprising opposite first and second surfaces. The method further comprises forming trenches into the semiconductor layer at the first surface. The method further comprises filling the trenches with a filling material including at least a semiconductor material. The method further comprises forming a thermal oxide at one or both of the first and second surfaces, the thermal oxide comprising a thickness of at least 200 nm. The method further comprises thermal processing of the semiconductor body configured to cause diffusion of the first and second dopants species into the filling material.

The present disclosure also relates to another method of forming a semiconductor device. The method comprises forming a semiconductor layer comprising a first dopant species of a first conductivity type and a second dopant species of a second conductivity type different from the first conductivity type, the semiconductor layer being part of a semiconductor body comprising opposite first and second surfaces. The method further comprises forming trenches into the semiconductor layer at the first surface. The method further comprises filling the trenches with a filling material including at least a semiconductor material. The method further comprises introducing non-dopant elements into the semiconductor layer by ion implantation. The method further comprises thermal processing of the semiconductor body configured to cause diffusion of the first and second dopants species into the filling material.

The present disclosure also relates to another method of forming a semiconductor device. The method comprises forming a semiconductor layer comprising a first dopant species of a first conductivity type and a second dopant species of a second conductivity type different from the first conductivity type, the semiconductor layer being part of a semiconductor body comprising opposite first and second surfaces. The method further comprises forming trenches into the semiconductor layer at the first surface. The method further comprises filling the trenches with a filling material including at least a semiconductor material. The method further comprises generating excess interstitial defects in the semiconductor layer. The method further comprises thermal processing of the semiconductor body configured to cause diffusion of the first and second dopants species into the filling material.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 10B illustrates a schematic top view on a semiconductor body portion of one embodiment of a lateral FET.

FIG. 10C illustrates a cross-sectional view along a line A-A' of the lateral FET illustrated in FIG. 10B.

FIG. 10D illustrates a cross-sectional view of a semiconductor body portion of one embodiment of a charge-separating pn junction such as a solar cell or a radiation detector.

DETAILED DESCRIPTION

Figure 1:
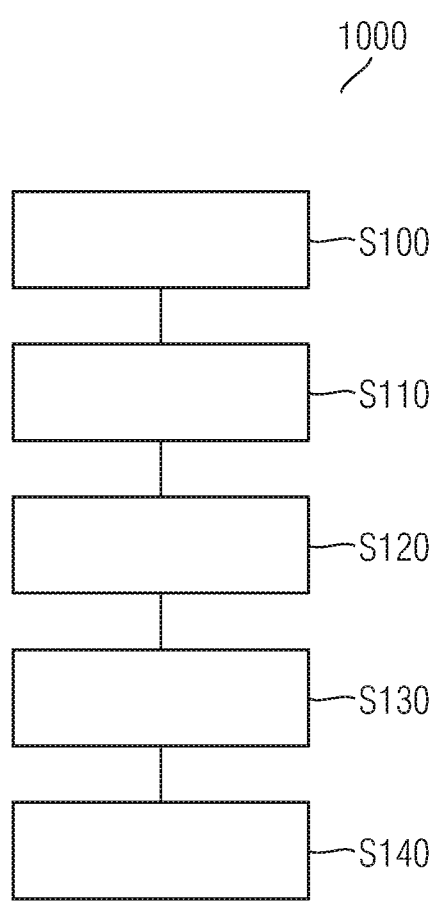
FIG. 1 is a schematic flow diagram for illustrating a method of manufacturing a semiconductor device comprising interstitial generation caused by thermal oxide formation.

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described by using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example, elements that temporarily provide a low-ohmic connection in a first state and a high-ohmic electric decoupling in a second state.

The Figures illustrate relative doping concentrations by indicating "−" or "+" next to the doping type "n" or "p". For example, "n-" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. As a typical base material for manufacturing a variety of such semiconductor devices, silicon wafers grown by the Czochralski (CZ) method, e.g. by the standard CZ method or by the magnetic CZ (MCZ) method or by the Continuous CZ (CCZ) method may be used. FZ (Float-Zone) silicon wafers may also be used. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation that is substantially parallel to a first or main surface of a semiconductor substrate or body. This can be for instance the surface of a wafer or a semiconductor die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside or rear surface while the first surface is considered to be formed by the upper, front or main surface of the semiconductor substrate. The terms "above" and "below" as used in this specification therefore describe a relative location of a structural feature to another.

In this specification, embodiments are illustrated including p- and n-doped semiconductor regions. Alternatively, the semiconductor devices can be formed with opposite doping relations so that the illustrated p-doped regions are n-doped and the illustrated n-doped regions are p-doped.

The semiconductor device may have terminal contacts such as contact pads (or electrodes) which allow electrical contact to be made with the integrated circuit or discrete semiconductor device included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example be in the form of a layer covering an area. Any desired metal, for example Cu, Ni, Sn, Au, Ag, Pt, Pd, Al, Ti and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein, one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Al, Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g. along four orthogonal directions in the plane of the tape. By dicing and pulling the tape, the semiconductor wafer is divided into a plurality of semiconductor dies (chips).

FIG. 1 is a schematic flow diagram for illustrating a method 1000 of manufacturing a semiconductor device.

It will be appreciated that while method 1000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

A schematic flow diagram for illustrating a method 1000 of manufacturing a semiconductor device is depicted in FIG. 1.

Process feature S100 comprises forming a semiconductor layer comprising a first dopant species of a first conductivity type and a second dopant species of a second conductivity type different from the first conductivity type, the semiconductor layer being part of a semiconductor body comprising opposite first and second surfaces. In some embodiments, the semiconductor layer is formed by a plurality of sub-layers subsequently arranged on each other, and wherein a thickness of each one of the plurality of sub-layers is set between 2 μm and 15 μm. The stack of sub-layers may be formed on a semiconductor substrate, for example. One of more of the sub-layers may be doped by introducing the first and second dopant species by ion implantation processes. In addition to the ion implantation processes, in-situ doping may be used, for example for one, e.g. the first or second dopants species, and/or for one or more than one of the sub-layers. An ion implantation dose and/or ion implantation energy for introducing the first and/or second dopant species into a corresponding one of the sub-layers may differ between some or all of the sub-layers. Different ion implantation doses and/or ion implantation energies may be used, for example when forming sub-layers having different thickness or when tuning a charge imbalance along a vertical direction perpendicular to first and second surfaces. Tuning the charge imbalance along a vertical direction may be beneficial with respect to improvement of an electrical breakdown behavior of a super-junction semiconductor device, for example with respect to a snap-back behavior of the current-voltage characteristic. In some embodiments, ion implantation energies of the first and second dopant species may be in a range of 20 keV to 10 MeV. In some embodiments, ion implantation energies of the first and second dopant species may be in a range of 50 keV to 500 keV. In some embodiments, an overall dose of doping of the first and second dopant species in the semiconductor layer differs by less than 20%, or less than 10%, or even less than 5%. The overall dose of doping corresponds to a dose summing up the dopants along a vertical direction through all of the sub-layers. In some embodiments, the first and second dopant species are selected such that a diffusion mechanism of one dopant species of the first and second dopant species is predominantly vacancy diffusion and a diffusion mechanism of the other one dopant species of the first and second dopant species is predominantly interstitial diffusion. In some embodiments, the one dopant species of the first and second dopant species based on predominantly vacancy diffusion is arsenic or antimony and the other one of the first and second dopant species based on predominantly interstitial diffusion is boron or aluminum.

Process feature S110 comprises forming trenches into the semiconductor layer at the first surface. The trenches may be formed by selectively removing material of the semiconductor body at the first surface, for example by a masked etch process such as wet and/or dry etching. In some embodiments, reactive ion etching may be used, for example. An etch mask may be a patterned hard mask comprising a nitride layer, a carbon layer or a stack of an oxide and nitride layer, for example a stack comprising $SiO_2$, $Si_3N_4$. In one or more embodiments, the first dopant species and the second dopant species may be implanted into the semiconductor layer through a sidewall of the trenches, for example by one or more tilted ion implantation processes. The etch mask or an alternative or additional mask may function as an ion implantation mask on the first surface of the semiconductor layer. The semiconductor layer may be fabricated by one layer deposition process or multiple layer deposition processes, for example CVD processes. After forming the trenches into the semiconductor layer at the first surface, the first dopant species and the second dopant species may be implanted into the semiconductor layer through a sidewall of the trenches by tilted ion implantation, for example.

Process feature S120 comprises filling the trenches with a filling material including at least a semiconductor material. In some embodiments, the trench is filled with an intrinsic or lightly doped semiconductor layer by an epitaxial layer formation process.

Process feature S130 comprises forming a thermal oxide at one or both of the first and second surfaces, the thermal oxide comprising a thickness of at least 200 nm, or at least 500 nm, for example a thickness greater than 1 μm or even greater than 2 μm.

In some embodiments, the method further comprises completely removing the thermal oxide at one or both of the first and second surfaces. Remaining parts of the thermal oxide may act as a field dielectric layer, for example in an edge termination area of the semiconductor device.

In some embodiments, formation of the thermal oxide comprises a thermal wet oxidation process, for example by using a furnace equipment. The thermal oxide may also be formed by a dry oxidation process. The thermal oxide may also be formed by a long wet oxidation bracketed by short dry ones, for example a dry-wet-dry cycle. In this case, the beginning and ending dry oxidations produce films of high-quality oxide at the outer and inner surfaces of the oxide layer, respectively. Wet oxidation sequences may lead to a greater rate of oxide growth and interstitial generation than dry oxidation, for example. This may be caused by lower temperatures of wet oxidation compared with dry oxidation that may allow for a greater difference in diffusion velocities of the first and second dopants species.

Thermal oxidation results in a generation of interstitials in the semiconductor body, thereby increasing a difference in diffusion velocities of the first and second dopant species. This is caused by an increase of the diffusion velocity of the one dopant species that is based on predominantly interstitial diffusion and by a decrease of the diffusion velocity of the other dopant species that is based on predominantly vacancy diffusion. Thus, a super-junction structure based on the local separation of the first and second dopant species may be improved.

In some embodiments, forming the thermal oxide at one or both of the first and second surfaces comprises forming the thermal oxide, removing the thermal oxide completely or partly, and forming again or increasing a thickness of the thermal oxide. This may be beneficial with regard to maintaining a high interstitial generation rate, for example.

In some embodiments, the method further comprises processes of removing the thermal oxide completely or partly, and forming again or increasing a thickness of the thermal oxide affecting a subarea of one or both of the first and second surfaces. Thereby, interstitial generation may be localized to areas where a high interstitial generation rate is desired, for example in an active area and/or in an edge termination area of a super-junction transistor, for example.

In some embodiments, the thermal oxide is formed at one of the first and second surfaces, and a protection layer configured to prevent surface oxidation is formed at another one of the first and second surfaces. Thereby, charge imbalance caused by pile-up effects during thermal oxidation at a front surface may be omitted, the front surface being the surface where electric contact to the super-junction structure is provided.

In some embodiments, the thermal oxide is formed at the first surface, and the method further comprises removing the thermal oxide in an active area of the semiconductor device and maintaining the thermal oxide in an edge termination area, the thermal oxide constituting a field dielectric. The method further comprises forming a junction termination structure in the edge termination area, forming a gate dielectric in the active area, and forming a field plate on the field dielectric. The thermal oxide used for increasing a difference in diffusion velocities of the first and second dopants species by interstitial generation is at least partly maintained as a field dielectric in the edge termination area.

Process feature S140 comprises thermal processing of the semiconductor body configured to cause diffusion of the first and second dopants species into the filling material.

In some embodiments, forming the thermal oxide at least partly coincides with thermal processing of the semiconductor body configured to cause diffusion of the first and second dopants species into the filling material. Thermal processing may comprise a temperature profile including one or more temperature levels, for example. Temperatures during thermal oxidation and thermal processing may be in a range of 800° C. to 1250° C., or in a range of 950° C. to 1150° C.

Figure 2:
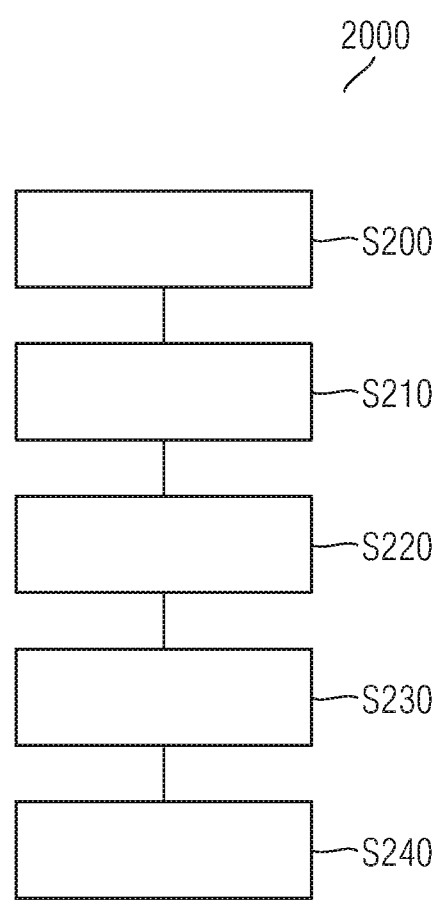
FIG. 2 is a schematic flow diagram for illustrating another method of manufacturing a semiconductor device comprising interstitial generation caused by ion implantation of non-dopant elements.

FIG. 2 is a schematic flow diagram for illustrating a method 2000 of manufacturing a semiconductor device.

It will be appreciated that while method 2000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases. Details on process features S100, S110, S120, S140, apply likewise to process features S200, S210, S220, S240, respectively.

A schematic flow diagram for illustrating a method 2000 of manufacturing a semiconductor device is depicted in FIG. 2.

Process feature S200, similar to process feature S100 depicted in FIG. 1, comprises forming a semiconductor layer comprising a first dopant species of a first conductivity type and a second dopant species of a second conductivity type different from the first conductivity type, the semiconductor layer being part of a semiconductor body comprising opposite first and second surfaces.

Process feature S210, similar to process feature S110 depicted in FIG. 1, comprises forming trenches into the semiconductor layer at the first surface.

Process feature S220, similar to process feature S120 depicted in FIG. 1, comprises filling the trenches with a filling material including at least a semiconductor material.

Process feature S230, other than process feature S130 depicted in FIG. 1, comprises introducing non-dopant elements into the semiconductor layer by ion implantation.

Process feature S240, similar to process feature S140 depicted in FIG. 1, comprises thermal processing of the semiconductor body configured to cause diffusion of the first and second dopants species into the filling material.

In some embodiments, the non-dopant elements include one or more of argon, germanium, silicon. A dose of the ion implantation ranges between $1\times10^{13}$ cm$^{-2}$ and $1\times10^{18}$ cm$^{-2}$. Other non-dopant elements may be used provided that they are suitable of generating excess interstitials by damaging the crystal lattice during ion implantation.

While the method described with reference to FIG. 1 is based on interstitial generation caused by thermal oxidation, the method described with reference to FIG. 2 is based on interstitial generation based on a damage implant of non-dopant elements.

In some embodiments, interstitial generation is caused by a combination of process features S130 and S230, i.e. thermal oxidation and damage implant while process features S100/S200, S110/S210, S120/S220 and S140/S240 remain as described with reference to FIGS. 1 and 2, respectively. According to yet another embodiment, other interstitial generation processes than the processes including process features S130, S230 may be used instead of or in combination with one or both of process features S130 and S230.

Figure 3:
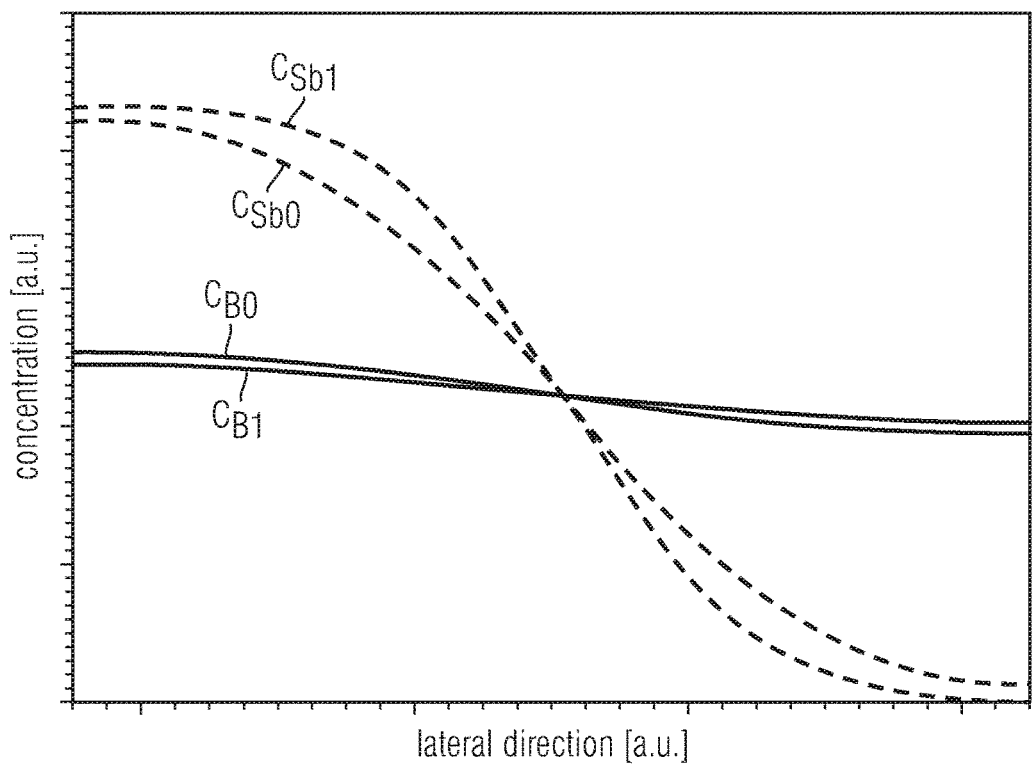
FIG. 3 is a graph illustrating simulated concentration profiles of antimony as n-type dopant species and boron as p-type dopant species versus a lateral direction from the semiconductor body into a trench filling.

The schematic graph of FIG. 3 illustrates simulated concentration profiles of antimony as n-type dopant species and boron as p-type dopant species versus a lateral direction from the semiconductor body into the trench filling. Curve $c_{sb0}$ denotes the antimony concentration profile caused by a method without interstitial generation, i.e. a method without an interstitial generation process as described with reference to FIGS. 1 and 2, for example. Curve $c_{sb1}$ denotes the antimony concentration profile caused by a method including interstitial generation by thermal oxidation as described with reference to FIG. 1. Curve $c_{B0}$ denotes the boron concentration profile caused by a method without interstitial generation, i.e. a method without an interstitial generation process as described with reference to FIGS. 1 and 2, for example. Curve $c_{B1}$ denotes the boron concentration profile caused by a method including interstitial generation by thermal oxidation as described with reference to FIG. 1. The thermal oxidation formation resulting in a generation of interstitials in the semiconductor body causes an increase of a difference in diffusion velocities of the antimony and boron dopant species due to an increase of the diffusion velocity of the boron that is based on predominantly interstitial diffusion. Thus, a super-junction structure based on the local separation of the arsenic and boron can be improved.

Figure 4:
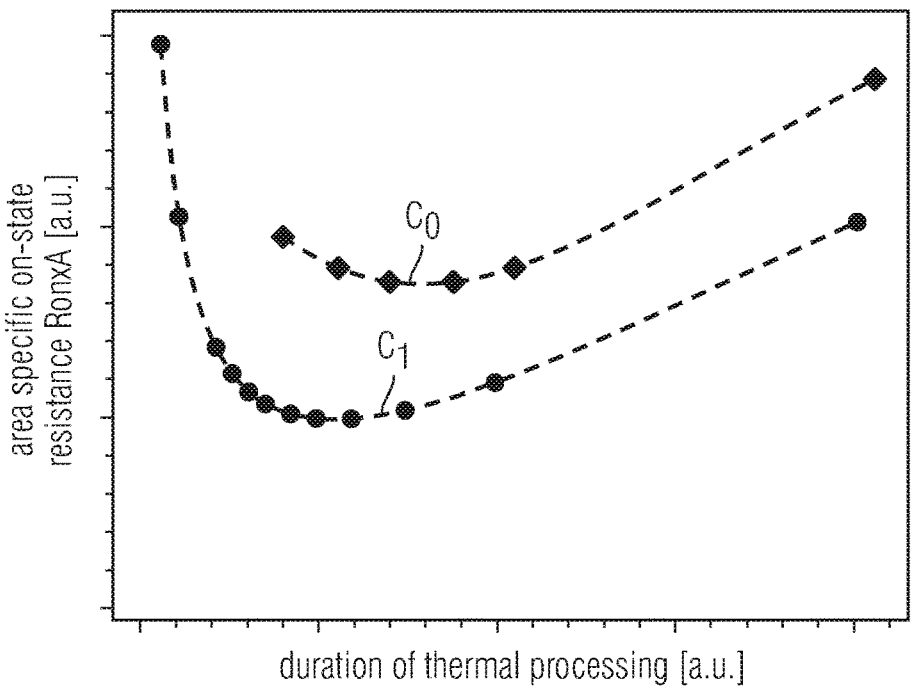
FIG. 4 is a graph illustrating simulated area-specific on-state resistances $R_{on} \times A$ of a super-junction semiconductor device versus a duration of the thermal processing described with respect to FIG. 1.

The schematic graph of FIG. 4 illustrates simulated area-specific on-state resistances $R_{on}xA$ of a super-junction semiconductor device versus a duration of the thermal processing described with respect to process feature S140 of FIG. 1. The super-junction structure of the simulated semiconductor device is based on a manufacturing method including the process features S100 to S140 of FIG. 1. Curve $c_0$ is based on simulated $R_{on}xA$ values of a superjunction structure formed by a method without interstitial generation, i.e. a method without an interstitial generation process as described with reference to FIGS. 1 and 2, for example. Curve $c_1$ is based on simulated $R_{on}xA$ values of a super-junction structure formed by a method including interstitial generation by thermal oxidation as described with reference to FIG. 1. Curve c1, i.e. a super-junction semiconductor device including a super-junction structure formed by process features as depicted in FIG. 1 allows for smaller $R_{on}xA$ values than any of the $R_{on}xA$ values simulated for super-junction devices including a super-junction structure formed by a method without interstitial generation, i.e. a method without an interstitial generation process as described with reference to FIGS. 1 and 2, for example.

Super-junction semiconductor devices comprising a super-junction structure formed by the method of any one of the methods described with respect to FIGS. 1 and 2 will be described below.

Figure 5:
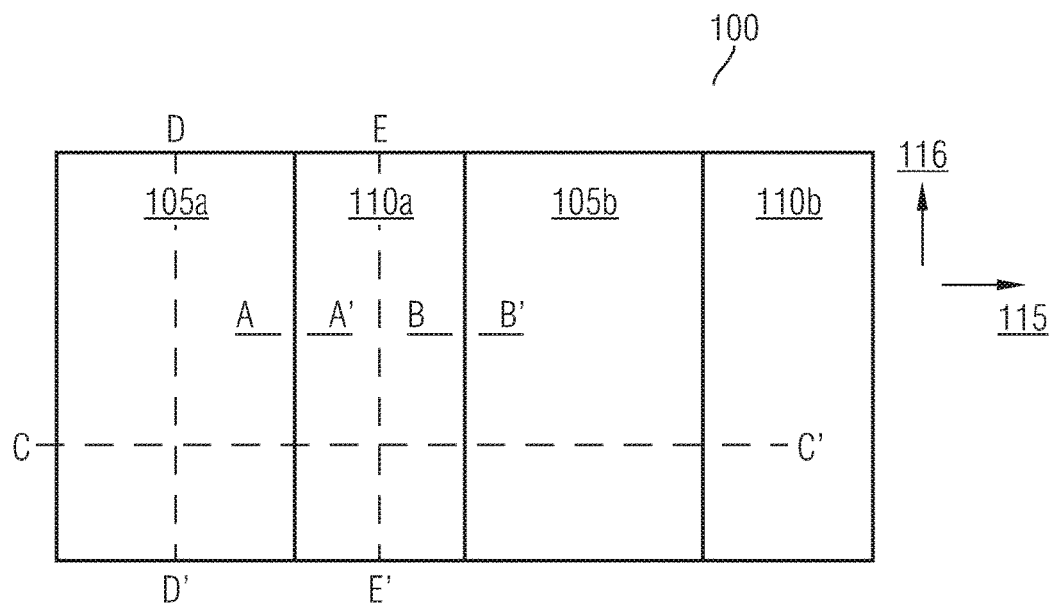
FIG. 5 illustrates one embodiment of a semiconductor device including a cross-sectional view of a semiconductor body portion having subsequently arranged first and second semiconductor zones of different conductivity type.

FIG. 5 illustrates a semiconductor body portion 100 of a semiconductor device including first semiconductor zones 105a, 105b of a first conductivity type and second semiconductor zones 110a, 110b of a second conductivity type different from the first conductivity type. The first and second semiconductor zones are alternately arranged along a lateral direction 115 extending in parallel to a front surface of the semiconductor body. The sequence of arrangement of these zones along the lateral direction 115 is first semiconductor zone 105a, second semiconductor zone 110a, first semiconductor zone 105b, second semiconductor zone 110b. These zones are arranged in contact with each other.

Each of the first semiconductor zones 105a, 105b includes a first dopant species of the first conductivity type and a second dopant species of the second conductivity type. Since each of the first semiconductor zones 105a, 105b is of the first conductivity type, a concentration of the first dopant species is larger within these zones than the concentration of the second dopant species.

Each of the second semiconductor zones 110a, 110b includes the second dopant species. These second semiconductor zones 110a, 110b may also include the first dopant species in a concentration lower than the concentration of the second dopant species.

One of the first and second semiconductor zones, i.e., the first semiconductor zones 105a, 105b or the second semiconductor zones 110a, 110b, constitute drift zones of the semiconductor device. A diffusion coefficient of the second dopant species is based on predominantly interstitial diffusion. As an example, the second dopant species may be boron or aluminum, for example.

The super-junction semiconductor device including the semiconductor body portion 100 illustrated in FIG. 5 may include further structural elements not illustrated in FIG. 5, either because these elements are located in a device portion different from the portion illustrated in FIG. 5 or because these elements are not illustrated for reasons of clarity. Examples for these elements not illustrated in FIG. 1 depend on the type of the device and may include one or a plurality of edge termination structures, measures for increasing avalanche robustness, semiconductor structures including body and source, drain, anode, cathode, gate structures including gate dielectrics and gate electrodes, insulation dielectrics, conductive structures such as contact plugs and metal layers, for example.

The first conductivity type may be an n-type and the second conductivity type may be a p-type. As a further example, the first conductivity type may be the p type and the second conductivity type may be the n-type.

The first and second semiconductor zones 105a, 105b, 110a, 110b constitute semiconductor drift- and compensation zones of different conductivity type. In a reverse operation mode of the device, an overall space charge of at least one of the first semiconductor zones may electrically compensate the space charge of at least one of the second semiconductor zones. An electrically active dose of at least one of the first semiconductor zones may also be smaller than 20%, or 10% or even 5% than the corresponding dose of one of the second semiconductor zones, whereby dose means ∫dN/dx in the first or second semiconductor zones in a lateral direction x such as lateral direction 115, whereby N is the effective concentration of n-type of p-type charge carriers.

Examples of materials of the first and second dopant species may include As and B, As and Al, Sb and B, Sb and Al. Strengthened interstitial diffusion as described above may result in an improved separation of the first and second dopant species which may result in a higher mobility of free charge carriers in the n-type drift zone and a lower $R_{on}$xA. The diffusion coefficients of the first and second dopant species may differ from each other by at least a factor of 2 with regard to a base material such as silicon. Thus, formation of the first and second semiconductor zones 105*a*, 105*b*, 110*a*, 110*b* having different conductivity type may be achieved by utilizing the different diffusion characteristics of these dopants within the semiconductor body supported by interstitial generation caused by processes such as process features S130 or S230 of FIGS. 1 and 2, respectively. For example, after diffusing the second dopant species into an intrinsic semiconductor volume, the conductivity type of the previously intrinsic semiconductor volume may be defined by the conductivity type of the dopant species having the larger diffusion coefficient, whereas the conductivity type of the semiconductor volume out of which these semiconductor species have been diffused may be defined by the conductivity type of the other dopant species having the lower diffusion coefficient.

One of the first and second semiconductor zones 105*a*, 105*b*, 110*a*, 110*b* may include at least one epitaxial semiconductor layer grown on a semiconductor substrate along a vertical direction 116 perpendicular to the lateral direction 115. The other one of the first and second semiconductor zones 105*a*, 105*b*, 110*a*, 110*b* may be arranged within trenches formed within the semiconductor body portion 100. These zones may include epitaxial semiconductor layers grown on sidewalls of the trenches along the lateral direction 115. A width of the first semiconductor zones 105*a*, 105*b* may be greater than a width of a mesa region between neighboring trenches, for example.

The first and/or second dopant species may be implanted into the semiconductor body. Thus, a beneficial precision of charge compensation of the first and second semiconductor zones 105*a*, 105*b*, 110*a*, 110*b* may be achieved. The first and/or second dopant species may be implanted by using a plurality of implant doses and/or a plurality of implant energies. When forming one of the first and second semiconductor zones 105*a*, 105*b*, 110*a*, 110*b* by a plurality of epitaxial semiconductor layers grown on a semiconductor substrate, one or both of the first and second dopant species may be implanted after formation of each of the epitaxial semiconductor layers. As a further example, one of the first and second dopant species, e.g., the one having the larger diffusion coefficient, may be merely implanted into some, e.g., every second or every third, of the subsequently grown epitaxial semiconductor layers. An implant dose of the first and/or second dopant species may be chosen larger for the uppermost and/or lowermost of the plurality of epitaxial semiconductor layers compared to the other ones of these layers, e.g., the implant dose of the faster diffusing dopant species may be chosen higher for the uppermost and/or lowermost layers. Thereby, diffusion of the first and/or second dopant species into a vertical direction through a bottom side or top side of the layer stack of the plurality of semiconductor epitaxial layers may be counterbalanced. The implantation doses of the first and second dopant species used for the implantation into the plurality of epitaxial layers may be chosen so that in the fully processed device an electrically active dose of at least one of the first semiconductor zones may also be smaller by 20%, or smaller by 10% or even smaller by 5% of the corresponding dose of one of the second semiconductor zones.

Apart from the semiconductor body portion 100 illustrated in FIG. 5, the semiconductor body may include a semiconductor substrate such as a silicon substrate or a Silicon-On-Insulator (SOI) substrate. The semiconductor substrate may also include one or a plurality of semiconductor layers such as epitaxial semiconductor layers formed thereon. The semiconductor body portion 100 may also be part of a doped semiconductor wafer, e.g., a doped Float-Zone (FZ) or Czochralski (CZ) silicon crystal material.

Figure 6:
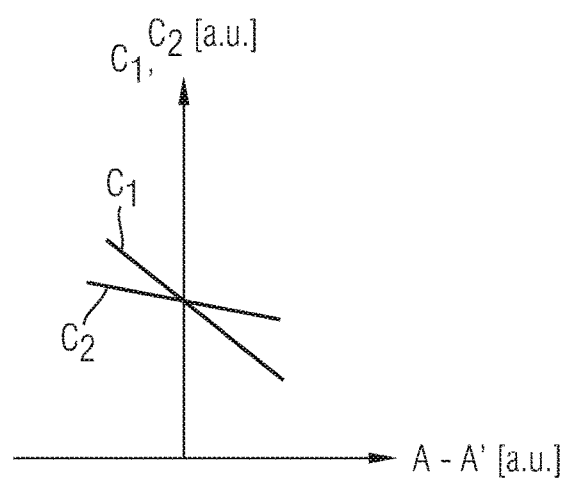
FIG. 6 illustrates a schematic diagram of an example of a concentration profile of first and second dopant species along a lateral direction A-A' illustrated in the cross-sectional view of FIG. 5.

FIG. 6 illustrates a schematic diagram of an example of a concentration profile of the first and second dopant species C1, C2 along the lateral direction A-A' illustrated in FIG. 5.

A concentration C1 of the first dopant species having the first conductivity type is larger within the first semiconductor zone 105*a* (i.e., left part of graph illustrated in FIG. 6) than the concentration C2 of the second dopant species having the second conductivity type. Contrary thereto, the concentration C2 of the second dopant species is larger within the second semiconductor zone 110*a* (i.e., right part of graph illustrated in FIG. 6) than the concentration C1 of the first dopant species within this zone. Thus, the conductivity type of first semiconductor zone 105*a* corresponds to the conductivity type of the first dopant species and the conductivity of the second semiconductor zone 110*a* corresponds to the conductivity type of the second dopant species.

In other words, a concentration of the dopants of each of the first and second species at an interface between one of the first semiconductor zones 105*a*, 105*b* and one of the second semiconductor zones 110*a*, 110*b* is decreasing along the lateral direction from the first to the second semiconductor zones. The dopant profiles intersect at the interface, whereas a gradient of the profile is larger for the first dopant species than the second dopant species.

Figure 7:
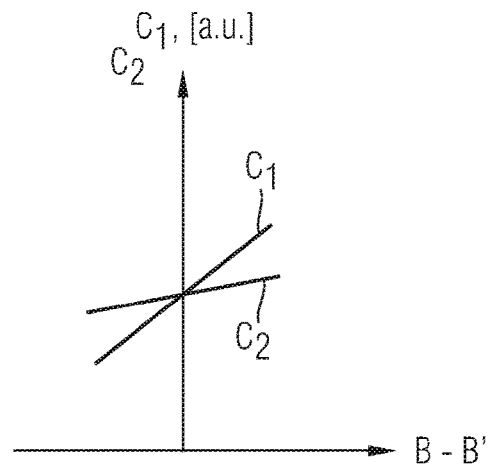
FIG. 7 illustrates a schematic diagram of an example of the concentration profile of the first and second dopant species along the lateral direction B-B' illustrated in the cross sectional view of FIG. 5.

FIG. 7 illustrates a schematic diagram of an example of a profile of concentration C1, C2 of the first and second dopant species along the lateral direction B-B' illustrated in FIG. 5.

A concentration C1 of the first dopant species is larger within the first semiconductor zone 105*b* (i.e., right part of graph illustrated in FIG. 7) than the concentration C2 of the second dopant species. Contrary thereto, the concentration C2 of the second dopant species is larger within the second semiconductor zone 110*a* (i.e., left part of graph illustrated in FIG. 7) than the concentration C1 of the first dopant species. Thus, a conductivity type of the first semiconductor zone 105*b* corresponds to the conductivity type of the first dopant species and the conductivity type of the second semiconductor 110*a* corresponds to the conductivity type of the second dopant species.

Figure 8A:
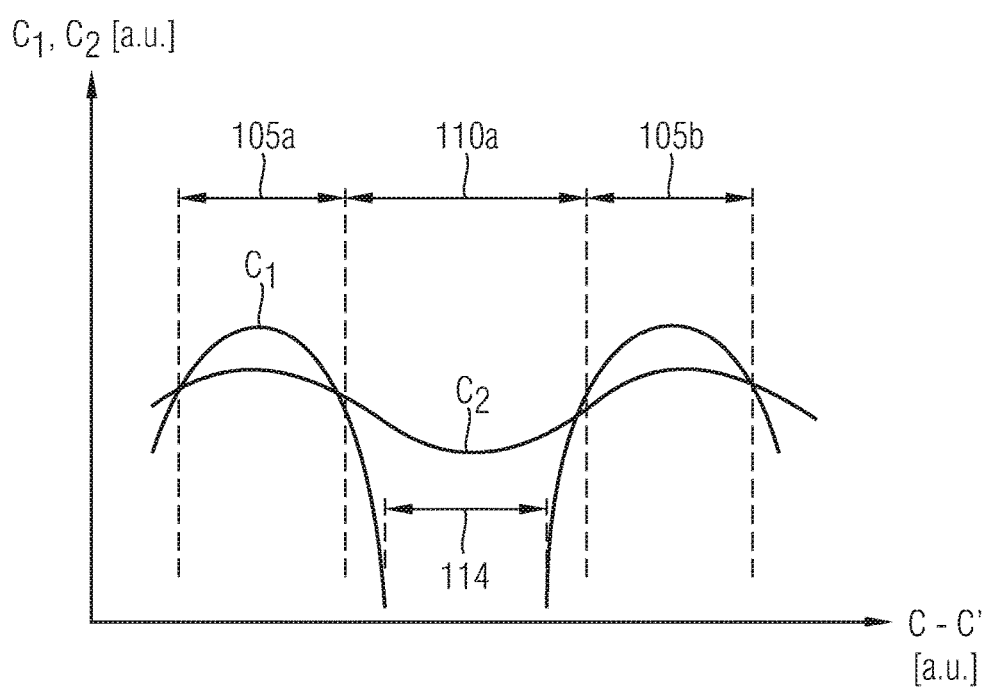
FIG. 8A illustrates a schematic diagram of a first example of a concentration profile of the first and second dopant species along a lateral direction C-C' illustrated in the cross-sectional view of FIG. 5.

FIG. 8A illustrates one example of a profile of concentrations C1, C2 of first and second dopant species along the lateral direction C-C' of the semiconductor body portion 100 illustrated in FIG. 5.

An intersection area between the profile of concentration C1 of the first dopant species and the profile of concentration C2 of the second dopant species defines an interface between a first semiconductor zone such as the first semiconductor zone 105*a* having a concentration C1 of the first dopant species that is larger than the concentration C2 of the second dopant species and a second semiconductor zone such as second semiconductor zone 110*a* having a concentration C2 of the second dopant species that is larger than the concentration C1 of the first dopant species. A schematic profile of concentrations C1, C2 such as illustrated in FIG. 8A may be manufactured by diffusing first and second dopant species from a volume of the first semiconductor zones such as the first semiconductor zones 105a, 105b into a volume of the second semiconductor zone such as the second semiconductor zone 110a, which may be undoped. A width of the first semiconductor zones 105a, 105b may be greater than a width of a mesa region between neighboring trenches, for example.

In the example illustrated in FIG. 8A, a diffusion coefficient of the second dopant species is at least twice as large as the diffusion coefficient of the first dopant species. A maximum of the concentration of dopants C1, C2 of each of first and second dopant species along the lateral direction C-C' is located in the center of each of the first semiconductor zones 105a, 105b having a same lateral distance to the neighboring ones of the second semiconductor zones. A minimum of the concentration C2 of the second dopant species is located in the center of each of the second semiconductor zones such as the second semiconductor zone 110a having a same lateral distance to the neighboring ones of the first semiconductor zones such as the first semiconductor zones 105a, 105b.

In the example illustrated in FIG. 8A, a region 114 free of first dopant species remains within each of the second semiconductor zones such as the second semiconductor zone 110a. A corrugation of each of the profile of concentration C1, C2 may be influenced by a plurality of parameters such as dimensions and distance of the regions acting as a diffusion reservoir, diffusion coefficients of the respective dopant species or thermal budget and time of diffusion of the respective species, for example.

Figure 8B:
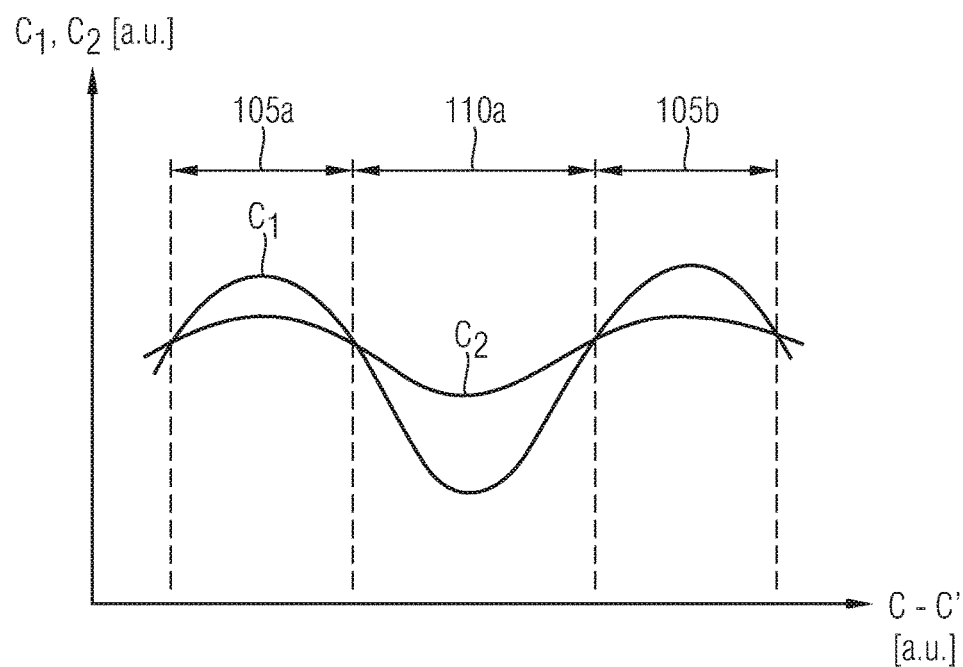
FIG. 8B illustrates a schematic diagram of a second example of the concentration profile of the first and second dopant species along the lateral direction C-C' illustrated in the cross-sectional view of FIG. 5.

The schematic diagram of FIG. 8B illustrates another example of a profile of concentrations C1, C2 along the lateral direction C-C' of the semiconductor body portion 100 of the device illustrated in FIG. 1. With regard to the location of maxima and minima, the profile of concentration C2 of the second dopant species is similar to the example illustrated in FIG. 8A.

The profile of concentration C1 of the first dopant species differs from the corresponding profile illustrated in FIG. 8A in that the first dopant species are located in an overall volume of second semiconductor zones such as the second semiconductor zone 110a. Thus, diffusion of the first dopant species out of neighboring diffusion reservoirs such as reservoirs located within first semiconductor zones 105a, 105b, is effected such that the two diffusion profiles will overlap and no semiconductor volume such as the region 114 free of first dopant species remains with the second semiconductor zones such as the second semiconductor zone 110a illustrated in FIG. 8A.

Figure 9A:
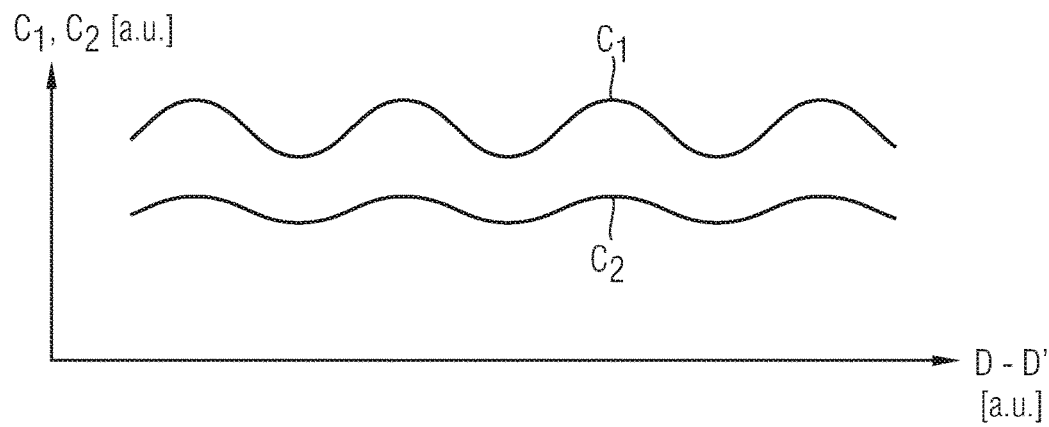
FIG. 9A illustrates a schematic diagram of a first example of a concentration profile of the first dopant and second dopant species along a vertical direction D-D' illustrated in the cross-sectional view of FIG. 5.

FIG. 9A illustrates one example of a profile of concentrations C1, C2 of the first and second dopant species along a vertical direction D-D' of the first semiconductor zone 105a within a semiconductor body portion 100 of the device illustrated in FIG. 5.

Both, the profile of concentration C1 of the first dopant species and the profile of concentration C2 of the second dopant species include maxima and minima along the vertical direction D-D'. The concentration C1 of the first dopant species is larger than the concentration C2 of the second dopant species. Thus, a conductivity type of this first semiconductor zone 105a equals the conductivity type of the first dopant species.

The number of maxima of the concentration profiles C1, C2 of each of the first and second dopant species along the vertical direction D-D' may correspond to the number of epitaxial semiconductor layers formed on a semiconductor substrate. The first and second dopant species may be implanted into each of the semiconductor epitaxial layers. Each implant into one of the semiconductor epitaxial layers may be carried out after formation of the one of the semiconductor epitaxial layers and before formation of the next one of the epitaxial semiconductor layers, for example. An implant dose of the first species may be equal to the implant dose of the second dopant species. These doses may also be nearly the same differing from each other by less than 20%, or 10%, or 5%, or 3% or 1% for at least one of the epitaxial semiconductor layers. By varying the doses, for example greater p- than n-doses in an upper half of the epitaxial layer(s) and greater n- than p-doses in a lower half of the epitaxial layer(s), a charge imbalance may be adjusted, for example an imbalance caused by excess p-charge in the upper half of the epitaxial layer(s) and a charge imbalance caused by excess n-charge in the lower half of the epitaxial layer(s). As an example, by adjusting the implant doses of the first and second dopant species to different values, e.g., to above embodiment values, a production tolerance with regard to the breakdown voltage of the resulting device may be improved. The maxima of the profile of concentration C1, C2 of the first and second dopant species may be shifted from each other along the vertical direction D-D' subject to implant energies chosen for implant of the first and second dopant species, for example.

Associated with the example of profiles of concentration C1, C2 illustrated in FIG. 9A is a profile of concentration C1, C2 of first and second dopant species along the vertical direction E-E' in the semiconductor body portion 100 of FIG. 1. This profile may also include maxima and minima along the vertical direction E-E'. In contrast to the relation C1>C2 holding true for the profiles along the vertical direction D-D' illustrated in FIG. 9A, C2>C1 may apply for the profiles along the vertical direction E-E' (not illustrated).

Figure 9B:
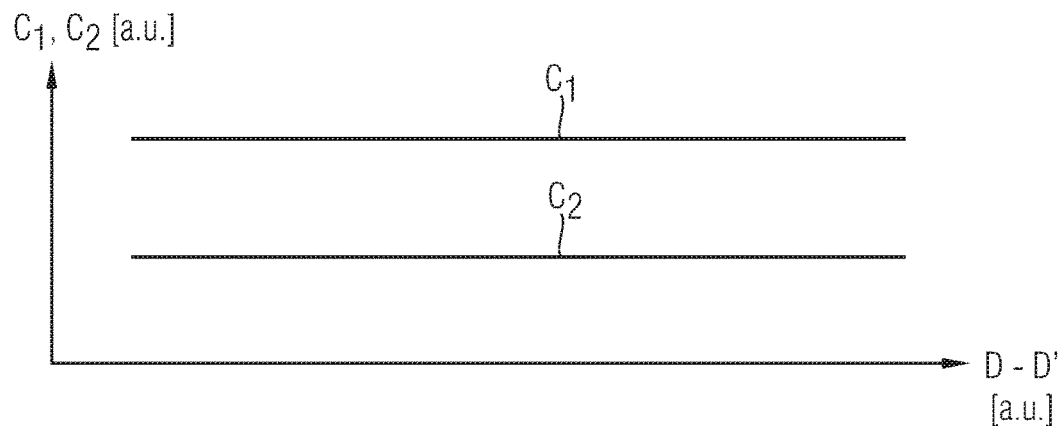
FIG. 9B illustrates a schematic diagram of a second example of the concentration profile of the first and second dopant species along the vertical direction D-D' illustrated in the cross-sectional view of FIG. 5.

FIG. 9B illustrates another example of a profile of concentrations C1, C2 along the vertical direction D-D' in the first semiconductor zone 105a of the semiconductor body portion 100 illustrated in FIG. 5.

In contrast to the example of profiles illustrated in FIG. 9A, the concentration profile C2 of the second dopant species having the larger diffusion coefficient includes less maxima along the vertical direction D-D' than the concentration profile C1 of the first dopant species. This may be achieved by using plural implant energies when implanting the second dopant species and/or, when forming a plurality of semiconductor epitaxial layers constituting the first semiconductor zones 105a, 105b, by implanting the second dopant species into less of these epitaxial layers than the first dopant species. One or both of these profiles may also slightly vary along the vertical direction D-D', e.g., by a fraction of 5%, or 10% or 20%. Such variations may allow to improve the avalanche robustness of the device or to improve the production tolerance with regard to the breakdown voltage of the device. As an example a concentration of the one of the dopants constituting the drift zone may have a peak maximum along the vertical direction D-D' which is higher than the other maxima, e.g., in a center of the drift zone along the vertical direction D-D'. This example may allow for improving avalanche robustness of the device. As another example, a concentration of the one of the dopants constituting the drift zone may have a peak maximum at or close to a top side and/or bottom side of the drift zone, the peak maximum being higher than the other maxima in the vertical direction. This further example may allow for counterbalancing vertical diffusion of dopants out of the drift zones to be formed.

Associated with the example of profiles of concentration C1, C2 illustrated in FIG. 9B are profiles of concentration C1, C2 of first and second dopant species along the vertical direction E-E' in the semiconductor body portion 100 of FIG. 5. In contrast to the relation C1>C2 holding true for the profiles along the vertical direction D-D', C2>C1 may apply for the profiles along the vertical direction E-E' (not illustrated).

Other examples of profiles of dopant concentrations C1, C2 along the vertical direction D-D' may include parts having maxima and minima and other parts of constant dopant concentration. Such profiles may be manufactured by a combination of in-situ doping and doping by implant of dopants, for example.

Figure 10A:
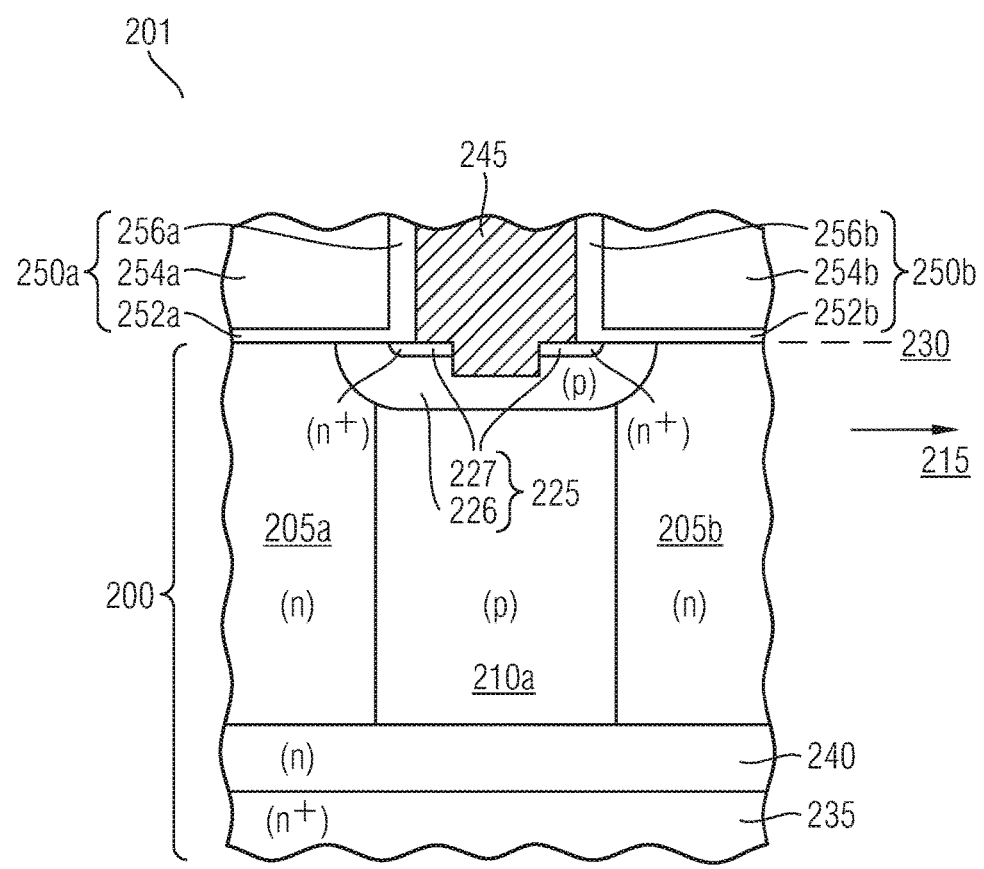
FIG. 10A illustrates a cross-sectional view of a semiconductor body portion of one embodiment of a vertical FET.

FIG. 10A illustrates a schematic cross-sectional view of a portion of a vertical FET 201 including n-type first semiconductor zones 205*a*, 205*b* and *p*-type second semiconductor zone 210*a*. These semiconductor zones are arranged sequentially along the lateral direction 215 in the sequence of first semiconductor zone 205*a*, second semiconductor zone 210*a* and first semiconductor zone 205*b*. The profile of concentrations of the first and second dopant species within these semiconductor zones may correspond to any of the respective examples above. The first semiconductor zones 205*a*, 205*b* constitute drift zones of FET 201. In a reverse operation mode of FET 201, free carriers may be removed from these regions and charge compensation between the first and second semiconductor zones may be achieved, i.e., the space charge of one of the first zones may electrically compensate the space charge of one of the second zones.

FET 201 includes a semiconductor structure 225 having a p-type body region 226 and n$^+$-type source region 227 formed at a front surface 230 of a semiconductor body portion 200.

An n$^+$-type drain 235 is formed at a back surface of the semiconductor body portion 200 opposite to the front surface 230. An n-type semiconductor zone 240 may be arranged between the first and second semiconductor zones 205*a*, 205*b*, 210*a* and the n$^+$ type drain 235. The n-type semiconductor zone 240 may have a concentration of dopants equal to the first semiconductor zones 205*a*. According to another example, a concentration of dopants of the n-type semiconductor zone 240 may be higher or lower than the concentration of the first semiconductor zones 205*a*, 205*b*. The n-type semiconductor zone 240 may be a field stop zone configured to improve robustness such as avalanche robustness of FET 201 by compensation of free electrons flowing as an Avalanche current in the blocking state, for example.

At the front surface 230, a conductive structure 245 is electrically coupled to the semiconductor structure 225. The conductive structure 245 may include conductive elements such as contact plugs and conductive layers of conductive material such as metals and/or doped semiconductors. The conductive structure 245 is configured to provide an electrical interconnection between FET 201 and further elements such as further circuit devices or chip pads, for example.

FET 201 also includes gate structures 250*a*, 250*b* including gate dielectrics 252*a*, 252*b*, gate electrodes 254*a*, 254*b* and insulating layers 256*a*, 256*b*.

FIG. 10B illustrates a schematic top view of a portion of a lateral FET 301 including n-type semiconductor zones 305*a* . . . 305*c* and *p* type semiconductor zones 310*a* . . . 310*c*. These semiconductor zones are sequentially arranged along a lateral direction 315 in the sequence of first semiconductor zone 305*a*, second semiconductor zone 310*a*, second semiconductor zone 310*a*, first semiconductor zone 305*b*, second semiconductor zone 310*b*, first semiconductor zone 305*c* and second semiconductor zone 310*c*. The profile of concentrations of the first and second dopant species within these semiconductor zones may correspond to any of the respective examples above. The first semiconductor zones 305*a* . . . 305*c* constitute drift zones of FET 301. In a reverse operation mode of FET 301, free carriers may be removed from these regions and charge compensation between the first and second semiconductor zones may be achieved, i.e., the space charge of one of the first zones may electrically compensate the space charge of one of the second zones.

FET 301 also includes an n$^+$-type drain 335 and a p-type body region 326. The first and second semiconductor zones 305*a* . . . 305*c*, 310*a* . . . 310*c* are arranged between the n$^+$-type drain 335 and the p-type body region 326 along the lateral direction 316. An n$^+$-type source region 327 is embedded within p-type body region 326 and a gate structure 350 is arranged so as to control the conductivity in a channel region between the n$^+$-type source region 327 and the drift zones by field effect. FET 301 may also include additional elements such as semiconductor regions not illustrated for reasons of clarity.

FIG. 10C illustrates a cross-sectional view of FET 301 illustrated in FIG. 10B along the line A-A'. The first and second semiconductor zones such as first semiconductor zone 305*c* constituting part of the drift zone, n$^+$-type drain 335, p-type body region 326 and n$^+$-type source region 327 are formed within a n-type semiconductor body portion 300. The gate structure 350 including a gate dielectric 352 and a gate electrode 354 is formed on the p-type body region 326. The gate structure 350 is arranged for controlling the conductivity of a lateral channel region 360 between the n$^+$-type source region 327 and the drift zones such as first semiconductor zone 305*c* by field effect. FET 301 may also include additional elements such as semiconductor regions or contact plugs not illustrated for reasons of clarity.

FIG. 10D illustrates a schematic cross-sectional view of a semiconductor body portion 400 of a charge separating pn junction device such as a solar cell 401 or a radiation detector including p-type semiconductor zones 405*a* . . . 405*e* and *n*-type semiconductor zones 410*a* . . . 410*d*. These semiconductor zones are sequentially arranged along a lateral direction 415. The profile of concentrations of the first and second dopant species within these semiconductor zones may correspond to any of the respective examples above. The electrically active dose of the vertical p- and n-type regions may differ more than for compensation devices, the difference ranging, for example, up to a factor of 10 or 5 or 2 or 50% or 20%. The first semiconductor zones 405*a* . . . 405*e* constitute base zones (drift zones) of solar cell 401 and the second semiconductor zones 410*a* . . . 410*d* constitute relatively low doped emitter zones of solar cell 401. A highly doped n$^+$-type emitter 470 is formed at a front surface 430 of semiconductor body portion 400 and a p$^+$-type base contact region 471 is formed at a back surface 431 of the semiconductor body portion 400. A lateral distance d between two neighboring ones of the first semiconductor zones 405*a* . . . 405*e* may be within a range of several tenth parts of the diffusion length to several diffusion lengths of electrons within the first semiconductor zones 405*a* . . . 405*e*.

The schematic cross-sectional views of FIGS. 11A to 11H illustrate an example of a method for manufacturing a super-junction semiconductor device.

Figure 11A:
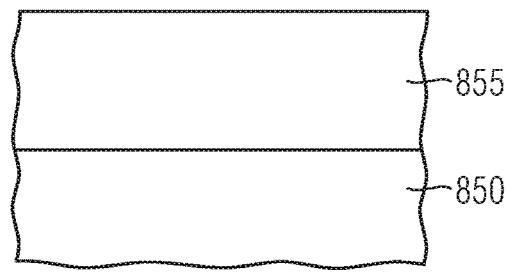
FIG. 11A is a schematic cross-sectional view of a semiconductor body portion for illustrating a method of manufacturing a semiconductor device in accordance with an embodiment.

Referring to the schematic cross-sectional view of FIG. 11A, a semiconductor substrate 850 is provided having an epitaxial layer 855 formed thereon. A thickness of the epitaxial layer 855 may be in a range of 3 µm to 15 µm, for example.

Figure 11B:
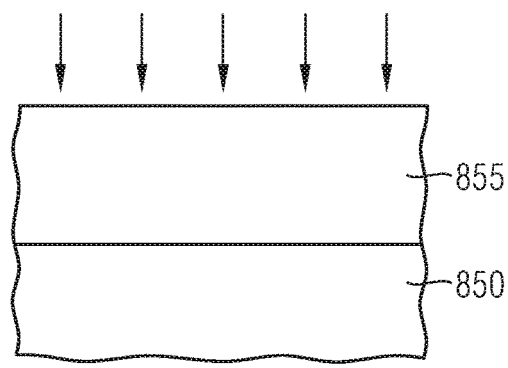
FIG. 11B illustrates a schematic cross-sectional view of the semiconductor body portion of FIG. 11A during implant of first dopant species and second dopant species.

Referring to the schematic cross-sectional view of FIG. 11B, a first dopant species of a first conductivity type and a second dopant species of a second conductivity type different from the first conductivity type are implanted into the epitaxial layer 855. Exemplary materials of the first and second dopant species may include As and B, As and Al, Sb and B, Sb and Al, respectively. Materials of the first and second dopant species may be chosen such that their diffusion coefficients with regard to the base material, e.g. silicon differ from each other by at least a factor of 2 and such that a diffusion mechanism of one dopant species of the first and second dopant species is predominantly vacancy diffusion and a diffusion mechanism of the other one dopant species of the first and second dopant species is predominantly interstitial diffusion.

Thus, with regard to silicon as the base material, B and P may not be materials suited for the first and second dopant species, for example.

The dopant species may be implanted into the epitaxial layer 855 using one or plural implant doses and one or plural implant energies. The process of forming the epitaxial layer 855 and implanting dopants into the epitaxial layer 855 may be repeated to provide a plurality of doped epitaxial semiconductor layers on the semiconductor substrate 850. In this way, a thickness of the drift zone may increase to a range of 10 µm to several 100 µm. Doping some of the epitaxial layers 855 with one of the first and second dopant species or both of the first and second dopant species may also be carried out in-situ, i.e., during formation of the epitaxial layer 855. In this case the thickness of the epitaxial semiconductor layer may be within a range of 10 µm to several 100 µm. When forming a plurality of semiconductor epitaxial layers, any combination of undoped, i.e., intrinsic epitaxial layers, in-situ doped epitaxial layers and epitaxial layers doped by implant of dopant species may be applied provided that the final layer stack constituting the drift zone includes the first dopant species and the second dopant species and at least part of these layers are doped by implant of dopant species. An overall amount of the first dopant species may correspond to the overall amount of the second dopant species. Thereby, precise charge compensation between the first and second semiconductor zones may be achieved by defining these zones on the basis of different diffusion profiles of the first and second dopant species. An implant dose of the first species may be equal to the implant dose of the second dopant species. These doses may also be nearly the same differing from each other by less than 20%, or 10%, or 5%, or 3% or 1% for at least one of the epitaxial semiconductor layers. As an example, by adjusting the implant doses of the first and second dopant species to different values, e.g., to above embodiment values, a production tolerance with regard to the breakdown voltage of the resulting device may be improved.

According to another example, a semiconductor substrate including the first and second dopant species may be provided. Thus, the process of implanting dopants illustrated in FIG. 11B is not required. An overall amount of the first dopant species may correspond to the overall amount of the second dopant species. The manufacturing method may continue with the processes illustrated in FIGS. 11C to 11E. An example of a doped semiconductor substrate is a semiconductor wafer doped with the first and second dopant species, e.g., doped Float-Zone (FZ) or Czochralski (CZ) or magnetic Czochralski (MCZ) silicon crystal material. When applying the manufacturing process for production of solar cells or detectors, doped semiconductor wafers may be used, for example. In case of solar cells and radiation detectors charge carriers generated by light absorption may have to diffuse a distance to a charge separating junction such as a pn junction. In case this distance is smaller than the diffusion length of the minority charge carriers these carriers likely contribute to the photocurrent and quantum efficiency may be increased. Above structure including the first and second semiconductor zones may be beneficial for such devices including vertical pn junctions. As an example, a lateral distance between two neighboring ones of the first and/or second semiconductor zones may be within a range of several tenth parts of the diffusion length to several diffusion lengths of the minority charge carriers in the respective one of the first and second semiconductor zones.

Thermal heating may be applied to diffuse the implanted dopant species. Thereby, a distribution of the implanted dopant species may be smoothed along a vertical direction perpendicular to a front surface. Prior to thermal heating, a capping layer such as $SiO_2$ may be formed to cover the front surface. This capping layer which may prevent out-diffusion of the implanted dopant species during this thermal heating may be removed in a later process. Prior to thermal annealing a vertical concentration profile such as a vertical implant profile of the one of the first and second dopant species having stronger diffusion may include an absolute maximum at a back side and/or the front side and one or several local maxima between the front side and the back side. Thereby enhanced vertical diffusion out of the silicon wafer or into the substrate of the one of the first and second dopant species having faster diffusion may be counter balanced.

Figure 11C:
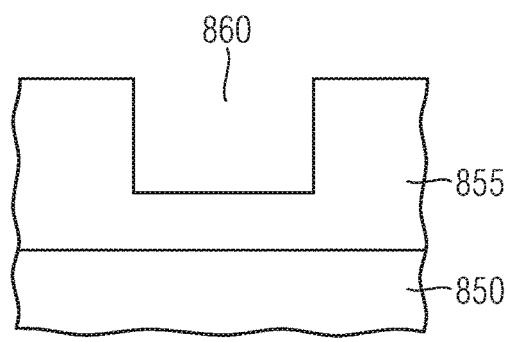
FIG. 11C illustrates a schematic cross-sectional view of the semiconductor body portion of FIG. 11B after forming a trench into the semiconductor body portion.

Referring to the schematic cross-sectional view illustrated in FIG. 11C, a trench 860 is formed in the epitaxial layer 855. The trench 860 may be formed by an etch process, for example. In the example illustrated in FIG. 11C, a bottom side of the trench 860 is located above a top side of the semiconductor substrate 850. According to another example, the trench 860 may extend into the semiconductor substrate 850 or may end at an interface between the epitaxial layer 855 and the semiconductor substrate 850.

Figure 11D:
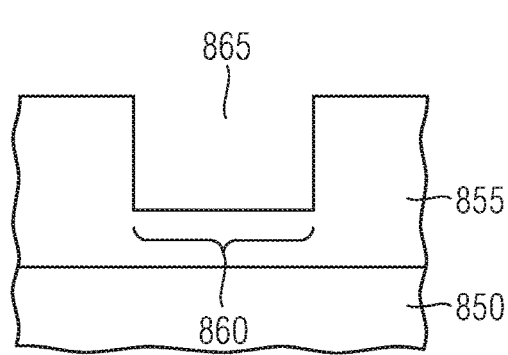
FIG. 11D illustrates a schematic cross-sectional view of the semiconductor body portion of FIG. 11C after filling the trench with a semiconductor material.

Referring to the schematic cross-sectional view illustrated in FIG. 11D, the trench is filled with a filling material 865 including at least a semiconductor material. As an example, the trench 860 may be filled by lateral epitaxy, i.e., by forming epitaxial layers on sidewalls of the trench 860. The epitaxial layers may be formed as intrinsic layers such as intrinsic Si layers. According to another example, the epitaxial layers may be doped in-situ. In latter case, a dopant concentration within the in-situ doped epitaxial layers may be smaller than the concentration of the first and second dopant species. After filling the trench 860, planarization and/or formation of a capping layer such as $SiO_2$ on the front side may be carried out.

Figure 11E:
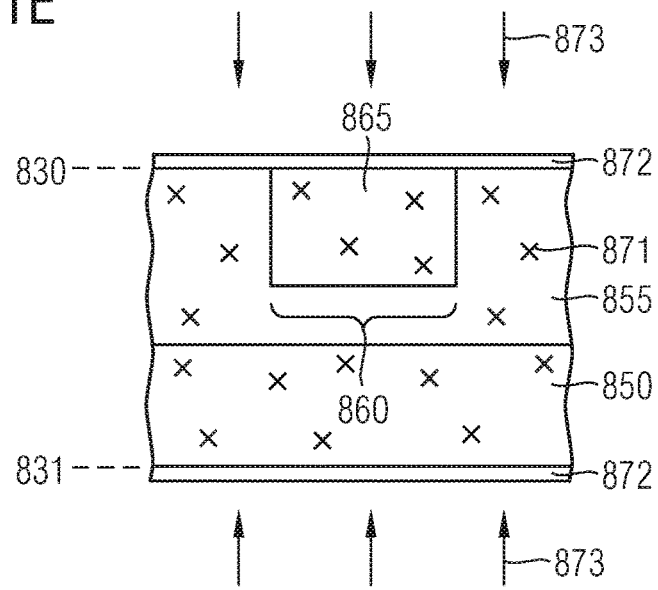
FIG. 11E illustrates a schematic cross-sectional view of the semiconductor body portion of FIG. 11D after interstitial generation by a thermal diffusion process and/or a damage implant of non-dopant elements.

Referring to the schematic cross-sectional view of FIG. 11E, interstitials 871 are generated in the semiconductor body comprising the epitaxial layer 855 and the semiconductor substrate 850 by formation of a thermal oxide 872 at a first and/or second surface 830, 831 of the semiconductor body as described with reference to FIG. 1. Although the thermal oxide 872 is illustrated at an overall area of the first and second surfaces 830, 831, the thermal oxide may only be formed on one of the first and second surfaces 830, 831 and may also be formed on only a part of a respective surface. In addition or as an alternative to formation of the thermal oxide 872, the interstitials 871 may also be formed by introducing non-dopant elements into the semiconductor body by ion implantation as described with reference to FIG. 2. Ion implantation may be carried out through the first and/or second surfaces 830, 831 and is schematically illustrated by arrows 873 in FIG. 11E. For further details on thermal oxidation and non-dopant implantation, reference is drawn to FIGS. 1 and 2 and the related parts of the specification. The thermal oxide may be completely or partly removed.

Figure 11F:
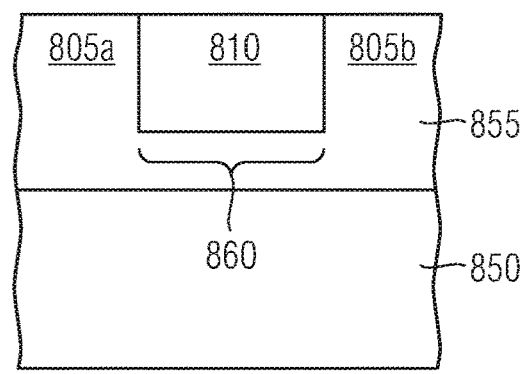
FIG. 11F illustrates a schematic cross-sectional view of the semiconductor body portion of FIG. 11E after diffusion of dopants into the semiconductor material filled in the trenches for defining first semiconductor zones of a first conductivity type and second semiconductor zones of a second conductivity type different from the first conductivity type.

Referring to the schematic cross-sectional view of FIG. 11F, by thermal processing of the semiconductor body, the first and second dopant species are diffused into a volume of the filled trench 860 by thermal processing as described with reference to process features S140, S240 of FIGS. 1 and 2, respectively. Due to the different diffusion coefficients of the first and second dopant species having different conductivity type and enhancement of diffusion of the dopant species based on predominantly interstitial diffusion, first zones 805a, 805b and a second zone 810 of different conductivity type are formed since the species having the larger diffusion coefficient will define the conductivity type within a volume of the filled trench 860. Assuming that the diffusion coefficient of the second dopant species is at least twice as large than the diffusion coefficient of the first dopant species, a conductivity type of the first zones 805a, 805b corresponds to the conductivity type of the first dopant species and the conductivity type of the second zone 810 corresponds to the conductivity type of the second dopant species. Examples of profiles of the first and second dopant species along a lateral and vertical direction within the first and second semiconductor zones are illustrated above with reference to FIGS. 5 to 9B.

Due to the difference in diffusion coefficients of the first and second dopant species, a semiconductor structure including a sequence of p-type and n-type semiconductor regions such as stripes or columns may be formed. Regardless of the thermal budget applied a beneficial charge compensation of these n- and p-type regions may be achieved since the one of the first and second dopant species having a larger diffusion coefficient partially counteracts the doping of the other one of these dopant species in a first portion having its conductivity defined by the other one of these dopant species, i.e., the dopant species having the smaller diffusion coefficient, whereas the one of these dopant species defines the conductivity type and dimensions of a second portion adjoining the first portion. That means the state of the charge compensation which has been realized before etching and prior to the lateral out-diffusion into the filled trench remains nearly unchanged because the faster diffusing dopant species remaining in portion one partially compensates the slower diffusing dopant species so that this difference which corresponds to the electrically active doping dose in portion one is equal to the amount of the difference of the faster and slower diffusing dopant species and, consequently the electrically active doping dose in portion two.

A value of the resulting dopant concentration of the portions constituting current path regions during operation such as drift zones may be adjusted by the dimensions such as width and form of the first portions and dimensions such as width and form of the second portions, implant doses and types of dopant species, temperature and duration of diffusion process for the first and second dopant species, for example. Before the diffusion of the first and second dopant species, these second portions may have been intrinsic regions formed within trenches. Thus, compensation zones having higher doping levels compared to compensation zones of existing devices such as doping levels of larger than $10^{16}$ $cm^{-3}$, larger than several times $10^{16}$ $cm^{-3}$ or larger than $10^{17}$ $cm^{-3}$ may be achieved.

Furthermore, a vertical variation of the doping levels may be kept smaller than in existing similar devices and the vertical pn junctions may exhibit a negligible curvature enabling low $R_{on}xA$ values for a given breakdown voltage of the device. The vertical variations of the doping levels may be kept substantially smaller than in existing similar devices provided that the difference between the maxima and minima illustrated in FIG. 9A is minimized by an appropriate selection of high temperature processes. The manufacturing costs of the proposed devices may be kept small since one lithography process may suffice to manufacture a drift zone with a charge compensation structure. Furthermore, a degree of charge compensation is independent from lithographic misalignment.

Further processes such as formation of body, source and drain and controlled thinning of a substrate such as a wafer from a back side may follow to finalize the desired semiconductor device. Examples for the semiconductor device manufactured by above method include MOSFETs, Insulated Gate Bipolar Transistors (IGBTs), SCRs, diodes, solar cells and pn junction radiation detectors, for example.

The first and/or second semiconductor zones constituting the compensation structure may be in the shape of stripes, columns, rings, hexagons, octagons and complementary structures, for example. When using stripes for the shape of the compensation structure, a width of the trenches and a distance between the trenches may be within a range of 100 nm and 10 µm, or between 200 nm and 3 µm.

In the area of an edge termination of the devices a distance and/or width of the trenches may be varied so as to lower the effective dopant concentration in this area, e.g., by increasing the width of or omitting some of the trenches. In addition or in one embodiment, conventional edge termination structures such as field plates and/or field rings may be used.

Figure 11G:
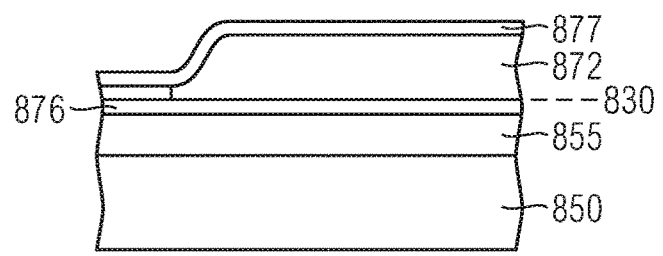
FIG. 11G illustrates a schematic cross-sectional view of the semiconductor body portion in an edge termination area including a remainder of the thermal oxide as a field dielectric.

As is illustrated in the schematic cross-sectional view of FIG. 11G, the thermal oxide 872 may only partly be removed at the first surface 830, for example in an active cell or device area and is maintained in an edge termination area. In the edge termination area, the remaining part of the thermal oxide constitutes a field dielectric. The edge termination structure is illustrated as a junction termination extension (JTE) region 876 in FIG. 11G, but may be replaced or supplemented by other junction termination structures, for example. A field plate 877 is arranged on the field dielectric. The field dielectric may merge with a thinner dielectric along a direction toward the active cell or device area.

Figure 11H:
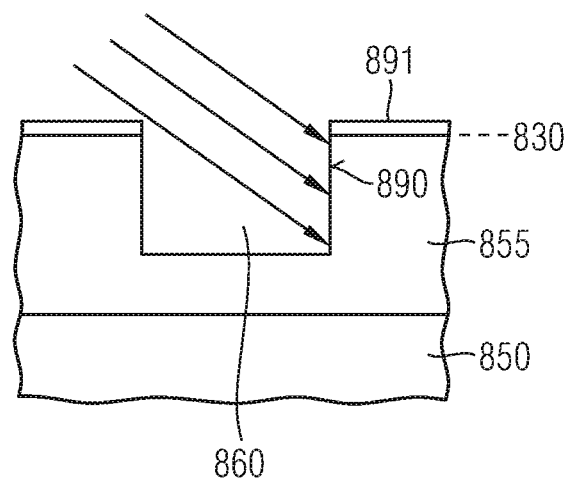
FIG. 11H illustrates a schematic cross-sectional view of the semiconductor body portion of FIG. 11C during implant of first dopant species and second dopant species into the semiconductor body portion through a sidewall of the trench.

Referring to the schematic cross-sectional view of FIG. 11H, the process illustrated in FIG. 11B may be replaced or supplemented by one or more tilted ion implantation processes of the first and second dopant species into the semiconductor layer 855 through a sidewall 890 of the trench 860. The ion implantation processes may be carried out based on one, two or more tilt angles, through one or opposite sidewalls of the trench, i.e. twist angles differing by 180°, or even based on three or more twist angles. A mask 891 may be arranged on the first surface 830. The process illustrated in FIG. 11H may be carried out between the processes illustrated in FIGS. 11C and 11D, for example.

Figure 12:
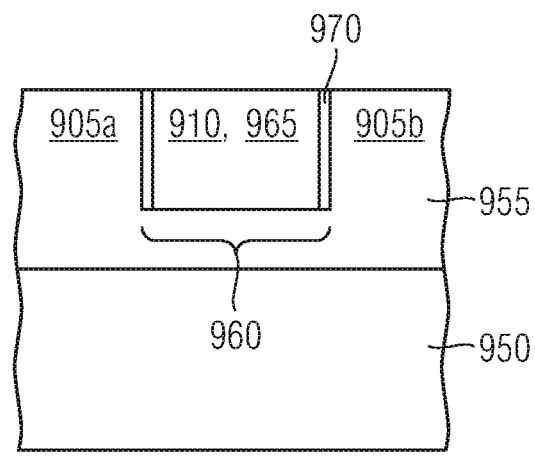
FIG. 12 illustrates a schematic cross-sectional of the semiconductor body portion of FIG. 11C after forming a barrier diffusion layer and filling the trench with a semiconductor material.

Referring to the schematic cross-sectional view of FIG. 12 in conjunction with FIGS. 11A-11H, another example of manufacturing a semiconductor device is illustrated. This method differs from the method illustrated in FIGS. 11A to 11F by the additional formation of a diffusion barrier 970 within the trench 960 along the sidewalls of the trench prior to the filling of the trench 960 with a filling material 965. A material of the diffusion barrier 970 may be chosen such that it hinders diffusion of one the first and second dopant species from the first zones 905a, 905b into the second zones 910. As an example, a diffusion barrier including layers of $SiO_2$ and $Si_3N_4$ may hinder the diffusion of P as the first dopant species.

Embodiments described herein are based on generation of interstitials in a semiconductor body, thereby increasing a difference in diffusion velocities of the first and second dopant species caused by an increase of the diffusion velocity of the one dopant species that is based on predominantly interstitial diffusion and by a decrease of the diffusion velocity of the other dopant species that is based on predominantly vacancy diffusion. Thus, a super-junction structure based on the local separation of the first and second dopant species can be improved. Interstitial generation may be caused by formation of a thermal oxide or by a damage implant suitable of generating excess interstitials. According to other embodiments, interstitials are generated by introducing oxygen into the semiconductor layer, for example by ion implantation through a bottom side and, in case of a tilted ion implantation, through sidewalls of the trenches prior to filling of the trenches with a filling material. As an alternative or in addition, oxygen may also introduced by plasma doping known as PLAD (plasma doping) or PIII (plasma immersion ion implantation). As an alternative or in addition, oxygen may also be introduced into the filling material by in-situ doping and/or ion implantation. The oxygen introduced into the semiconductor layer and/or the filling material may then react with a material of the semiconductor layer and/or filling material, for example with silicon at voids located at or around an interface between the filling material and the semiconductor layer, thereby forming an oxide associated with generation of the excess interstitials.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
    forming a semiconductor layer comprising a first dopant species of a first conductivity type and a second dopant species of a second conductivity type different from the first conductivity type, the semiconductor layer being part of a semiconductor body having opposite first and second surfaces;
    forming trenches in the semiconductor layer at the first surface;
    filling the trenches with a filling material including at least a semiconductor material;
    forming a thermal oxide at one or both of the first and second surfaces, the thermal oxide having a thickness of at least 200 nm, so as to form interstitials in the semiconductor layer; and
    thermal processing of the semiconductor body to diffuse the first and second dopants species across at least some of the interstitials in the semiconductor layer that are formed by forming the thermal oxide and into the filling material.

2. The method of claim 1, wherein the thermal oxide is formed at the first surface, and the method further comprises:
    removing the thermal oxide in an active area of the semiconductor device and maintaining the thermal oxide in an edge termination area, the thermal oxide constituting a field dielectric;
    forming a junction termination structure in the edge termination area; and
    forming a gate dielectric in the active area.

3. The method of claim 1, further comprising completely removing the thermal oxide at one or both of the first and second surfaces.

4. The method of claim 1, wherein forming the thermal oxide at least partly coincides with the thermal processing of the semiconductor body.

5. The method of claim 1, wherein forming the thermal oxide comprises a thermal wet oxidation process.

6. The method of claim 1, wherein forming the thermal oxide comprises:
    initially forming the thermal oxide;
    removing the thermal oxide completely or partly; and
    forming again or increasing a thickness of the thermal oxide.

7. The method of claim 6, wherein removing the thermal oxide completely or partly and forming again or increasing the thickness of the thermal oxide affect a subarea of one or both of the first and second surfaces.

8. A method of manufacturing a semiconductor device, the method comprising:
    forming a semiconductor layer comprising a first dopant species of a first conductivity type and a second dopant species of a second conductivity type different from the first conductivity type, the semiconductor layer being part of a semiconductor body having opposite first and second surfaces;
    forming trenches in the semiconductor layer at the first surface;
    filling the trenches with a filling material including at least a semiconductor material;
    introducing non-dopant elements into the semiconductor layer by ion implantation so as to form interstitials in the semiconductor layer; and
    thermal processing of the semiconductor body to diffuse the first and second dopants species across the interstitials in the semiconductor layer that are formed by the non-dopant elements and into the filling material.

9. The method of claim 8, wherein a diffusion mechanism of one of the first and second dopant species is predominantly vacancy diffusion and a diffusion mechanism of the other one of the first and second dopant species is predominantly interstitial diffusion.

10. The method of claim 9, wherein the dopant species having the diffusion mechanism that is predominantly vacancy diffusion is arsenic or antimony, and wherein the dopant species having the diffusion mechanism that is based on predominantly interstitial diffusion is boron or aluminum.

11. The method of claim 8, wherein an overall dose of doping of the first and second dopant species in the semiconductor layer differs by at most 20%.

12. The method of claim 8, wherein the semiconductor layer comprises a plurality of sub-layers subsequently arranged on each other, and wherein a thickness of each one of the plurality of sub-layers is between 2 µm and 15 µm.

13. The method of claim 12, wherein one of more of the sub-layers is doped by introducing the first and second dopant species by the ion implantation process.

14. The method of claim 8, wherein filling the trenches with a filling material comprises filling the trench with an intrinsic or lightly doped semiconductor layer by an epitaxial layer formation process.

15. A method of manufacturing a semiconductor device, the method comprising:
forming a semiconductor layer comprising a first dopant species of a first conductivity type and a second dopant species of a second conductivity type different from the first conductivity type, the semiconductor layer being part of a semiconductor body having opposite first and second surfaces;
forming trenches in the semiconductor layer at the first surface;
filling the trenches with a filling material including at least a semiconductor material;
generating excess interstitial defects in the semiconductor layer; and
thermal processing of the semiconductor body to diffuse the first and second dopants species across the excess interstitial defects in the semiconductor layer and into the filling material.

16. The method of claim 15, wherein a ratio of a concentration of the interstitial defects to a concentration of vacancies in the filling material is greater than ten.

17. The method of claim 15, wherein generating excess interstitial defects in the semiconductor layer comprises:
introducing oxygen into the semiconductor layer and/or filling material; and
forming an oxide at voids located at or around an interface between the filling material and the semiconductor layer.

18. The method of claim 15, wherein the first dopant species and the second dopant species are implanted into the semiconductor layer through a sidewall of the trenches.

19. The method of claim 1, wherein a diffusion mechanism of the first dopant species is predominantly vacancy diffusion and a diffusion mechanism of the second dopant species is predominantly interstitial diffusion, and wherein a diffusion velocity of the second dopant species is increased relative to a diffusion velocity of the first dopant species during the thermal processing of the semiconductor body due to the presence of the interstitials in the semiconductor layer.

20. The method of claim 8, wherein a diffusion mechanism of the first dopant species is predominantly vacancy diffusion and a diffusion mechanism of the second dopant species is predominantly interstitial diffusion, and wherein a diffusion velocity of the second dopant species is increased relative to a diffusion velocity of the first dopant species during the thermal processing of the semiconductor body due to the presence of the interstitials in the semiconductor layer.

21. The method of claim 15, wherein a diffusion mechanism of the first dopant species is predominantly vacancy diffusion and a diffusion mechanism of the second dopant species is predominantly interstitial diffusion, and wherein a diffusion velocity of the second dopant species is increased relative to a diffusion velocity of the first dopant species during the thermal processing of the semiconductor body due to the presence of the interstitials in the semiconductor layer.

* * * * *